(12) United States Patent
Yamazaki et al.

(10) Patent No.: US 6,544,826 B1
(45) Date of Patent: *Apr. 8, 2003

(54) METHOD FOR PRODUCING SEMICONDUCTOR DEVICE

(75) Inventors: Shunpei Yamazaki, Tokyo (JP); Hisashi Ohtani, Kanagawa (JP); Hideto Ohnuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/717,142

(22) Filed: Nov. 22, 2000

Related U.S. Application Data

(62) Division of application No. 09/098,004, filed on Jun. 16, 1998, now Pat. No. 6,156,590.

(30) Foreign Application Priority Data

Jun. 17, 1997 (JP) .............................................. 9-176353

(51) Int. Cl.⁷ ................................................ H01L 21/00
(52) U.S. Cl. ........................ 438/166; 438/308; 438/486
(58) Field of Search ................................ 438/166, 308, 438/486, 482, 471, 476; 257/77, 58, 59, 57, 60, 67, 66, 69, 70

(56) References Cited

U.S. PATENT DOCUMENTS

| | | |
|---|---|---|
| 4,746,628 A | 5/1988 | Takafuji et al. |
| 4,943,837 A | 7/1990 | Konishi et al. |
| 5,028,560 A | 7/1991 | Tsukamoto et al. |
| 5,147,826 A | 9/1992 | Liu et al. |
| 5,294,571 A | 3/1994 | Fujishiro et al. |
| 5,403,772 A | 4/1995 | Zhang et al. |
| 5,422,287 A | 6/1995 | So |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,518,936 A | 5/1996 | Yamamoto et al. |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |

(List continued on next page.)

OTHER PUBLICATIONS

Van Zant, Peter Microchip Fabrication, Third Ed. "Crystal Growth and Wafer Preparation" pp. 50–64.

*Primary Examiner*—Carl Whitehead, Jr.
*Assistant Examiner*—Laura M Schillinger
(74) *Attorney, Agent, or Firm*—Eric J. Robinson; Robinson Intellectual Property Law Office, P.C.

(57) ABSTRACT

In producing TFT by crystallizing an amorphous silicon film by the action of nickel, the influence of nickel on the TFT produced is inhibited. A mask 104 is formed over an amorphous silicon film 102, and a nickel-containing solution is applied thereover. In that condition, nickel is kept in contact with the surface of the amorphous silicon film at the opening 103 of the mask. Then, this is heated to crystallize the amorphous silicon film. Next, a phosphorus-containing solution is applied thereto, so that phosphorus is introduced into the silicon film in the region of the opening 103. This is again heated, whereby nickel is gettered in the region into which phosphorus has been introduced. In this process, the nickel concentration in the silicon film is reduced.

26 Claims, 7 Drawing Sheets

U.S. PATENT DOCUMENTS

| | | |
|---|---|---|
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kasumoto et al. |
| 5,663,077 A | 9/1997 | Adachi et al. |
| 5,677,549 A | 10/1997 | Takayama et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,893,730 A | 4/1999 | Yamazaki et al. |
| 5,985,740 A | 11/1999 | Yamazaki et al. |
| 6,156,590 A * | 12/2000 | Yamazaki et al. .......... 438/166 |

* cited by examiner

METHOD FOR PRODUCING SEMICONDUCTOR DEVICE

This application is a Divisional of application Ser. No. 09/098,004 filed Jun. 16, 1998 now U.S. Pat. 6,156,590.

BACKGROUND OF THE INVENTION

1. Field of the Invention

The present invention relates to a method for producing thin film transistors (hereinafter referred to as TFT), in which is used a metal element such as typically nickel capable of promoting the crystallization of silicon.

2. Description of Related Art

Known are TFT having a silicon film formed on a glass or quartz substrate. Most commercially-available products are amorphous silicon TFT having an amorphous silicon film as the active layer.

TFT are essentially used in active matrix circuits in active matrix-type liquid crystal display devices.

TFT having an amorphous silicon film as the active layer are defective in that they could be put into practical use only for N-channel devices, and that their acting speed is very low. (It may be said that TFT are used only in active matrix circuits because of such defects.)

As one technique for solving the problem, known is a method of using a crystalline silicon film as the silicon film constituting the active layer.

To obtain such a crystalline silicon film, employable is any of laser irradiation or heating.

The former method of laser irradiation comprises applying a laser ray to an amorphous silicon film having been formed through CVD or the like to thereby crystallize the film.

The latter heating method comprises heating an amorphous silicon film having been formed through CVD or the like to thereby crystallize the film.

For the laser irradiation method for crystallization, however, commercially-available laser oscillation devices are not still at practicable level, and therefore the method is problematic essentially in point of the oscillation stability. For that reason, the crystalline silicon films to be obtained in the method are problematic in point of their uniformity and producibility.

On the other hand, the heating method may produce films of stable quality. However, as requiring high heating temperatures, the method is problematic in that glass substrates are difficult to use therein. In addition, since the films formed in the method are in a definite polycrystalline condition, they shall have therein grain boundaries which are unstable factors.

Given that situation, one problem is how to lower the heating temperatures for crystallization. Another problem is of attaining a step of producing films without forming any definite grain boundaries therein.

To solve those problems, the present applicant has developed a technique of crystallizing an amorphous silicon film at a temperature lower than that for conventional crystallization. In the technique developed, used is a metal element such as typically nickel element for the crystallization.

Precisely, the technique is based on a method comprising introducing a predetermined metal element such as typically nickel into an amorphous silicon film followed by heating the film to convert it into a crystalline silicon film.

According to this technique, the crystalline silicon film obtained through heat treatment at about 600° C. or so to which glass substrates are resistant shall have a high degree of crystallinity.

Regarding the quality of the film to be obtained in the technique, the film does not have any definite grain boundaries therein, and is therefore superior to any other conventional, definite polycrystalline silicon films.

However, the method where a metal element is used is problematic in that the metal element used remains in the crystalline silicon film formed.

The metal element remaining in a semiconductor film acts as a trap center and has some negative influences on the characteristics of TFT comprising the film. Therefore, it is desirable to reduce as much as possible the concentration of the metal element remaining in a semiconductor film that constitutes the active layer of TFT.

SUMMARY OF THE INVENTION

The invention disclosed herein is to provide a technique of improving TFT having, as the active layer, a crystalline silicon film to be formed by the use of a metal element capable of promoting the crystallization of silicon, and is characterized in that the concentration of the metal element remaining in the active layer of TFT is reduced as much as possible.

One aspect of the invention disclosed herein is a method for producing a semiconductor device, which comprises;

a step of forming a crystalline silicon film in the presence of a metal element capable of promoting the crystallization of silicon, a step of applying a solution containing phosphorus, selectively to a part of the surface of the crystalline silicon film, and a step of heating the film to thereby make the metal element gettered in the region to which the solution has been selectively applied.

In this aspect, nickel is most favorably used as the metal element capable or Promoting the crystallization of silicon. This is because nickel is the most effective for the intended crystallization and gettering. Especially for the gettering, the combination of nickel and phosphorus is the most effective.

The metal element may be one or more selected from Fe, Co, Ni, Ru, Rh, Pd, Os, Ir, Pt, Cu, Au, Ge, Pb, In and Sb.

In the heating step, in general, the film may be heated in any ordinary heating furnace equipped with a heater. Apart from this, also employable is so-called RTA for exposure to strong radiations.

The phosphorus-containing solution may be a solution containing $P_2O_5$ and/or $H_xPO_3$.

As the phosphorus-containing solution, also employable is a phosphorus-containing, silicon oxide film-forming liquid. As one typical example of the liquid, mentioned is an OCD solution manufactured by Tokyo Chemical Industry Co.

This solution is, after having been applied onto a substrate and baked thereon, solidified to give a silicon oxide film. The solution requires a step of solidifying it to have a solid phase.

As the phosphorus-containing solution, further employable is a solution containing a phosphoric acid compound dissolved therein.

After the phosphorus-containing solution is applied to the crystalline silicon film, the film is then processed according to any of the following methods (1) to (3) to thereby make phosphorus kept in contact with a part of the surface of the crystalline silicon film;

(1) Blowing off an excess of the phosphorus-containing solution by a spin dry process, (2) Blowing off a liquid component of the phosphorus-containing solution by heating and dry process, (3) Forming a film such as silicon oxide film by baking to solidify the phosphorus-containing solution.

Then, heating the film makes phosphorus slightly diffuse (bleed) into the crystalline silicon film, by which nickel is gettered.

Another aspect of the invention is a method for producing a semiconductor device, which comprises;

a step of applying a solution containing a metal element capable of promoting the crystallization of silicon, selectively to a part of the surface of an amorphous silicon film to thereby make the solution kept in contact with the selected part, a step of heating the film so as to diffuse the metal element from the region of said part to another region, thereby attaining crystal growth in the direction parallel to the surface of the film, a step of applying a solution containing phosphorus, selectively to the region of said part to thereby make the solution kept in contact with said part, and a step of again heating the film to thereby make the metal element gettered in the region of said part.

Still another aspect of the invention is a method for producing a semiconductor device, which comprises;

a step of applying a solution containing a metal element capable of promoting the crystallization of silicon, selectively to a part of the surface of an amorphous silicon film to thereby make the solution kept in contact with the selected part, a step of heating the film so as to diffuse the metal element from the region of said part to another region, thereby attaining crystal growth in the direction parallel to the surface of the film, a step of applying a solution containing phosphorus, selectively to the region of said part to thereby make the solution kept in contact with said part, and a step of again heating the film to thereby make the metal element move along the route opposite to the route of said diffusion.

Still another aspect of the invention is a method for producing a semiconductor device, which comprises;

a step of forming a crystalline silicon film by the action of a metal element capable of promoting the crystallization of silicon, a step of making a phosphorus-containing material kept in contact selectively with a part of the surface of the resulting crystalline silicon film, and a step of heating the film to thereby make the metal element gettered in said part.

In this aspect, the phosphorus-containing material is formed by applying a phosphorus-containing, silicon oxide film-forming liquid, selectively to the intended part of the surface of the crystalline silicon film, followed by heating it to form a silicon oxide film on the part of the surface of the crystalline silicon film.

In one embodiment of this aspect, formed is a PSG film or a silicon oxide film from the Tokyo Chemical's OCD solution.

BRIEF DESCRIPTION OF THE DRAWINGS

FIG. 1A to FIG. 1E show a process for forming a crystalline silicon film.

DESCRIPTION OF PREFERRED EMBODIMENTS OF THE INVENTION

Preferred embodiments of the invention are described below, with reference to the drawings attached hereto.

As in FIG. 1A to FIG. 1E, a mask 104 is formed on an amorphous silicon film 102, to which is applied a nickel-containing solution.

In that condition, nickel element is kept in contact with the surface of the amorphous silicon film at the opening 103.

Next, the film is heated and crystallized. Next, a phosphorus-containing solution is applied to this so that phosphorus is kept in contact with the silicon film in the region of the opening 103.

Next, this is heated, whereby the nickel element is gettered in the region into which phosphorus has been introduced. In this step, the nickel element gathers in the region with which phosphorus is kept in contact, while moving along the route opposite to the route along with it diffused in the step of crystal growth in FIG. 1C. As a result, the amount of the nickel element in the silicon film is reduced.

Now, the invention is described in more detail with reference to the following Examples, which, however, are not intended to restrict the scope of the invention.

EXAMPLE 1

FIG. 1A to FIG. 1E and FIG. 2A to FIG. 2E are referred to, which show the process of Example 1 of producing an N-channel TFT according to lateral crystal growth morphology.

Figure 1A:
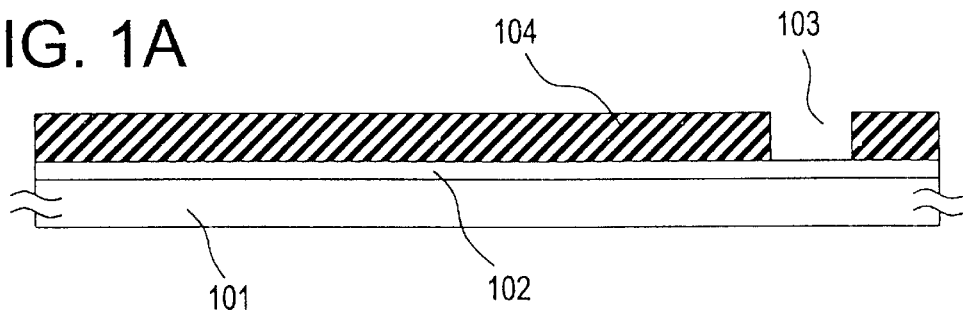
Figure 1B:
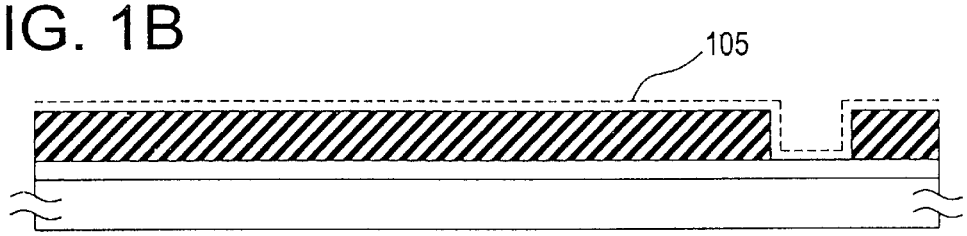
Figure 1A:
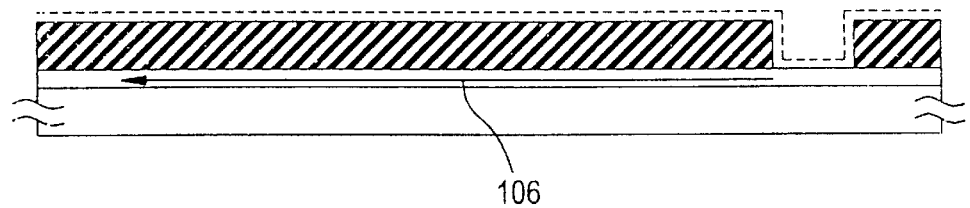

As in FIG. 1A, an amorphous silicon film 102 is formed on a glass substrate 101 through thermal low-pressure CVD, the film 102 formed having a thickness of 50 nm.

Plasma CVD may be employed for the formation of the amorphous silicon film, to which, however, thermal low-pressure CVD is preferred, since the amorphous silicon film formed through the latter is suitable to the purpose of obtaining a crystalline silicon film from it.

The glass substrate may have a silicon oxide film or a silicon nitride oxide film on its surface as the underlying layer.

Apart from the glass substrate, also employable is a quartz substrate or a semiconductor substrate having an insulating film formed thereon.

After the amorphous silicon film 102 has been formed, a silicon oxide film having a thickness of 120 nm is formed thereon through plasma CVD. Then, this silicon oxide film is patterned into a mask 104. This mask 104 is used in the next step of selectively introducing a metal element, nickel capable of promoting the crystallization of silicon, into the film 102. (FIG. 1A)

This mask 104 has an opening 103, at which the amorphous silicon film 102 is exposed outside. The horizontal cross section of this opening 103 is of a long and narrow rectangular form that extends from the front side of the drawing to the depth thereof. Accordingly, in the condition of FIG. 1A, the surface of the amorphous silicon film 102 is exposed outside at the part of the opening 103, while having a long and narrow rectangular form.

Next, a nickel acetate solution is applied to the masked silicon film 102, whereby the surface of the masked film 102 is kept in contact with nickel element 105, as in FIG. 13.

In this condition, the nickel element is kept in contact with the surface of the amorphous silicon film 102 at the part of the opening 103. In other words, in this condition, the nickel element is selectively introduced into the amorphous silicon film.

Next, this is heated at 570° C. for 14 hours. In this step, silicon crystals grow in the direction 106 that is parallel to the substrate, or that is, in the direction that is parallel to the film, as in FIG. 1C. This crystal growth is referred to as lateral crystal growth.

The crystal growth reaches 100 μm or longer. If, however, the heating temperature is 580° C. or higher, spontaneous nucleation (crystal growth not assisted by the action of nickel) will interfere with the lateral crystal growth. Therefore, attention shall be paid so that the heating temperature is not too high.

Specifically, it is important that the heating step is effected at a temperature at which no spontaneous nucleation occurs.

Next, a phosphorus-containing solution is applied to this, and then spontaneously dried. As a result, phosphorus 107 is kept in contact with the surface, as in FIG. 1D.

As the phosphorus-containing solution, herein used is a solution of a mixture of phosphoric acid and a salt of phosphoric acid.

In this condition, phosphorus is selectively kept in contact with the surface of the amorphous silicon film 102 having been exposed outside at the bottom of the opening 103 formed in the mask 104.

Figure 1D:
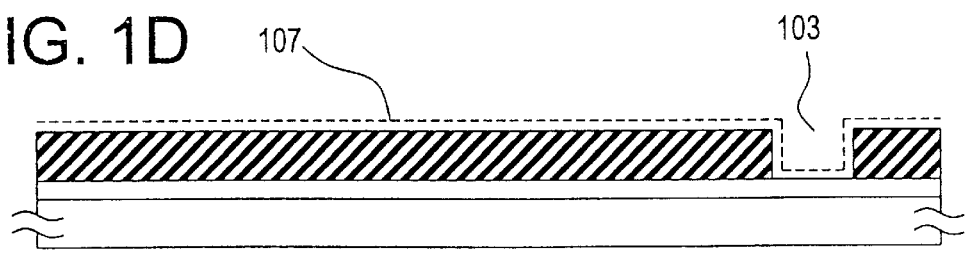

In the step of FIG. 1D, the concentration of the solution is so controlled that the density of phosphorus having been applied and existing in the unit surface might be higher than the density of nickel having been applied in the previous step of FIG. 15.

Considering the nickel-gettering efficiency in the next step, it is desirable that the density of phosphorus is not smaller than 10 times that of nickel. Concretely, for this, it is desirable that the phosphorus concentration in the solution is not smaller than $1 \times 10^{20}$ atoms/cm$^3$.

The change in the amount of phosphorus to be introduced is easy, as the phosphorus-containing solution is used.

Next, the thus-coated substrate is again heated. Concretely, this is heated in a nitrogen atmosphere at 600° C. for 2 hours, using a heating furnace. In this step, the nickel element having diffused in the film moves in the route 108, and is thus gettered in the region of the opening 103.

The nickel-moving route 108 is just opposite to the route along which the nickel element diffused in the crystallization step of FIG. 1C.

In this step, nickel is fixed as nickel phosphide in the region into which phosphorus was introduced (that is, the region of the opening 103).

The bonding condition of phosphorus and nickel may be in any form of NiP or NiP$_2$, and the bonding is extremely stable.

In general, phosphorus does not almost move at a temperature of 600° C. or so, but nickel actively moves at such a temperature of 600° C. or so.

Accordingly, nickel phosphide is concentrated at the region into which phosphorus was introduced. In this condition, nickel is gettered by phosphorus.

In that manner, obtained is a lateral crystal growth region in which the nickel element concentration of the film is reduced.

The heating temperature for the nickel gettering may be selected from the range falling between 550° C. and 800° C., but preferably between 600° C. and 750° C.

If the temperature is higher than the defined range, phosphorus will diffuse at such a high temperature so that the intended object of concentrating nickel in a predetermined region could not be attained.

On the other hand, if the temperature is lower than the defined range, the nickel diffusion distance will be short so that the intended object of concentrating nickel in a predetermined region could not also be attained.

The heating for the gettering may also be attained by so-called RTA for exposure to strong radiations such as infrared light. If desired, the heating may be combined with laser irradiation.

Figure 1E:
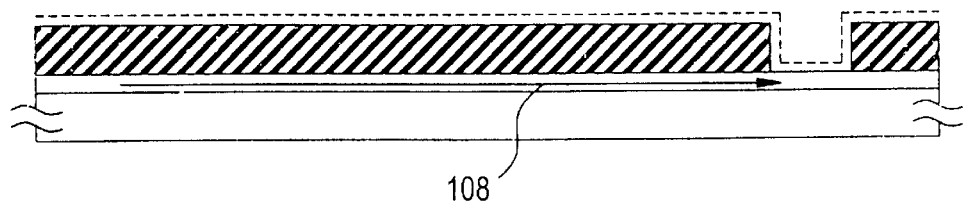

After the step of FIG. 1E, the nickel phosphide component and the phosphorus silicide component are removed. In this removing step, the silicon film having been exposed outside in the region of the opening 103 is selectively removed.

Figure 2A:
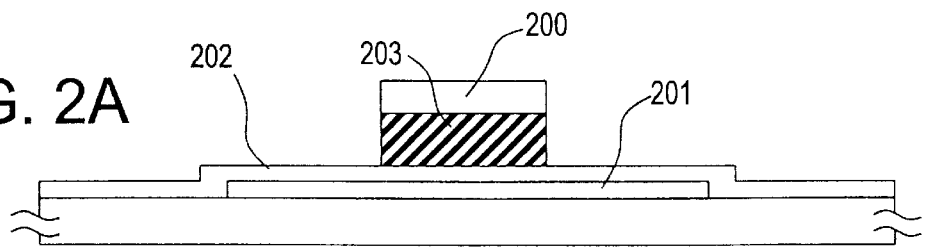
FIG. 2A to FIG. 2E show a process for forming a TFT.

Next, a silicon film pattern 201 is formed on the crystalline silicon film except the region of the opening 103 at which the film is exposed outside and except the region at which the lateral crystal growth is terminated. (FIG. 2A)

This pattern shall be the active layer of the TFT to be produced herein. This pattern is so defined that the axis extending in the direct on in which the carriers will move through channels when the TFT is driven is aligned with the axis extending in the crystal growth direction (that is, in the lateral crystal growth direction) referred to in the above.

In the silicon film obtained herein, the direction in which grain boundaries extend corresponds almost to the crystal growth direction. In other words, in this film, the ratio of the grain boundaries that exist while intersecting the lateral crystal growth direction is extremely small.

Accordingly, by aligning the axis along which the carriers move with the directional axis of the lateral crystal growth, it is possible that the carrier movement is hardly retarded. In that manner, the TFT obtained herein may have high-quality characteristics.

After the formation of the active layer pattern 201, a silicon oxide film 202 that functions as a gate-insulating film is formed through a plasma CVD to have a thickness of 100 nm. (FIG. 2A)

Next, an aluminum film is formed through sputtering to have a thickness of 400 nm. Then, a resist mask 200 is positioned thereover. Via this resist mask 200, the aluminum film is patterned to give an aluminum pattern 203.

As a result, obtained is the layered constitution as in FIG. 2A. Next, a porous oxide film 204 is formed through anodic oxidation to have a thickness of 400 nm. This step is effected while the resist mask 200 is still on the aluminum pattern so that the anodic oxidation is attained only on the side surfaces of the aluminum pattern. (FIG. 2B)

Next, the resist mask 200 is removed, and then anodic oxidation is again effected. In this step, formed is a dense oxide film 205 to have a thickness of 70 nm. In this step, since the electrolytic solution penetrates even into the depth of the porous oxide film 204, the dense oxide film 205 is formed inside the porous anodic oxide film 204. (FIG. 2B)

Figure 2B:
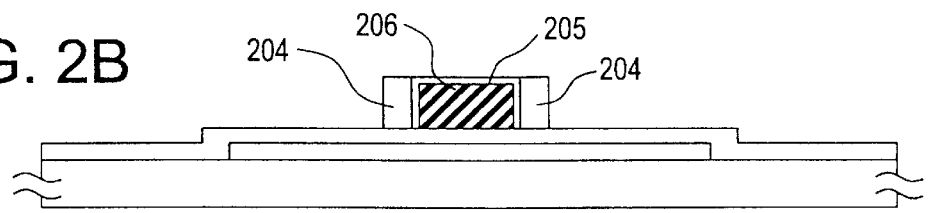

As a result, obtained is the layered constitution as in FIG. 2B. Next, phosphorus is doped according to a plasma doping method.

Figure 2C:
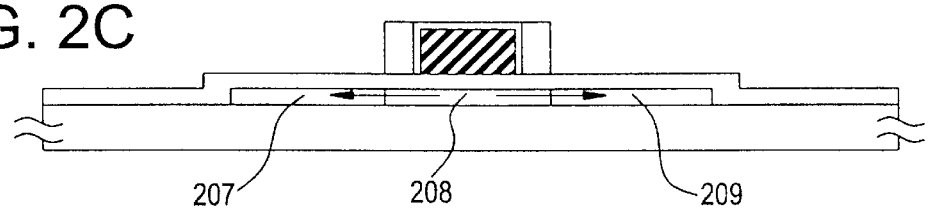

In this step, phosphorus is doped into the regions 207 and 209, as in FIG. 2C. However, no phosphorus is doped into the region 208.

This doping may be effected in any ordinary condition for forming source and drain regions.

The phosphorus doping in this step is to determine the source/drain regions and to remove the nickel element from the region 208.

The region 207 shall be the source region, and the region 208 shall be the drain region. A channel region is formed at the region 211 and low concentration impurity regions are formed adjacent thereto.

Next, this structure is heated at 450° C. for 2 hours. In this step, the nickel element remaining in the region 208 moves from the region 208 to the regions 207 and 209.

In this step, the thus-moved nickel is gettered by the phosphorus having been doped into the regions 207 and 209.

Next, the porous oxide film 204 is selectively removed. After this, phosphorus is again doped. The doping in this step is lighter, or that is, the phosphorus dose to be doped is smaller than that in the previous step illustrated in FIG. 2C.

Figure 2D:
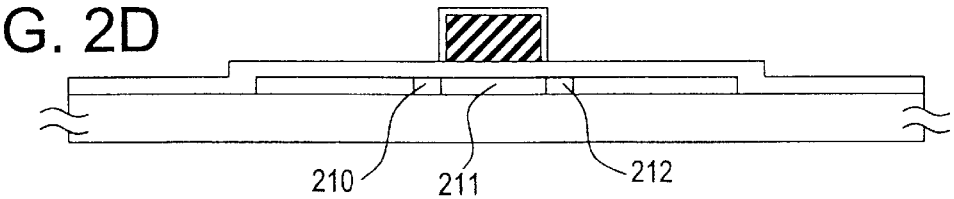

As a result of this step, a lower dose of phosphorus is doped in the regions 210 and 212. These regions shall be low concentration impurity regions. (FIG. 2D)

The low concentration impurity regions are meant to have a lower impurity concentration than the regions 207 and 209. In this meaning, the regions 207 and 209 shall be impurity-rich regions.

The dimension of the impurity-poor regions 210 and 212 is determined by the length of the porous oxide film 204 grown.

The region 211 not doped shall be the channel region of the TFT. Offset regions, of which the thickness corresponds to the thickness of the dense oxide film 205, will be formed to be adjacent to the channel region. In this, since the oxide film 205 is thin to have a thickness of 70 nm, the offset region is omitted herein.

After the doping, laser rays are applied to this to thereby anneal the crystal structure having been damaged by the doping and to activate the dopant. This step may be attained through exposure to strong radiations.

In that manner, formed are the source region 207, the drain region 209, the impurity-poor regions 210 and 212 and the channel region 211.

Figure 2E:
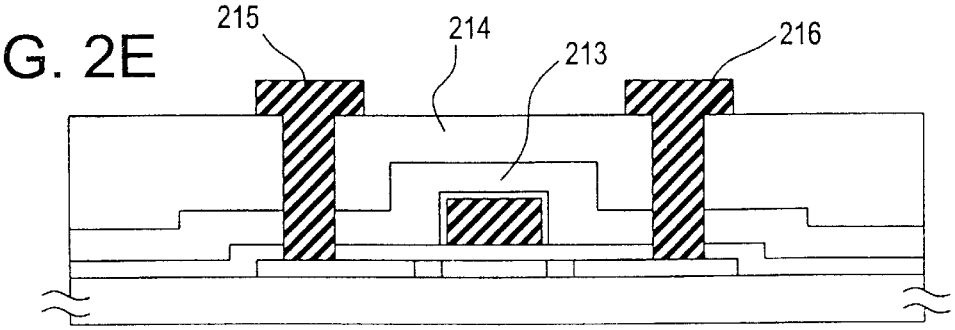

After the condition shown in FIG. 2D is obtained, an interlayer insulating film of a silicon nitride film 213 is formed to have a thickness of 200 nm, as in FIG. 2E. Next, an acrylic resin film 214 is formed thereover according to a spin-coating method. The acrylic resin film shall have a thickness of at least 600 nm. Next, a source electrode 215 and a drain electrode 216 are formed. In that manner, completed is the N-channel TFT as in FIG. 2E.

To introduce phosphorus in the step of FIG. 1E, also employable is a method of using a PSG film, in place of the solution method. Further employable is a method of exposing the sample to an atmosphere at least containing a small amount of phosphorus-containing gas such as $PH_3$.

To carry out these methods, a PSG film is formed on the sample which is in the condition shown in FIG. 1E, or the sample is exposed to an atmosphere containing $PH_3$.

EXAMPLE 2

This is to demonstrate a modification of the process of Example 1, in which an electroconductive silicon film is used as the gate electrode.

Where a silicon film is used as the gate electrode, the heating in the step of FIG. 2C may be effected at an elevated temperature to which the glass substrate is resistant, for example, at 650° C. or so. The heat treatment at such an elevated temperature further enhances the nickel gettering into the regions 207 and 209.

As the material for the gate electrode, employable is any of various silicide materials and various metal materials. For example, employed is tantalum, tantalum nitride or the like material.

EXAMPLE 3

This is to demonstrate another modification of the process of Example 1, in which is produced a P-channel TFT.

To produce a P-channel TFT, only boron is doped in the steps of FIG. 2C and FIG. 2D. In this case, no gettering is attained in the step of FIG. 2C.

This is because boron has no gettering activity. In other words, boron is not expected to produce the effect of phosphorus.

EXAMPLE 4

This is to demonstrate another example of producing a P-channel TFT, in which Kettering is attained in the step of FIG. 2C.

In this, the same steps of FIG. 2A, FIG. 2B and FIG. 2C as in Example 1 are repeated. In this, therefore, the process to produce the N-channel TFT is repeated to give the layered constitution as in FIG. 2C. After the step of FIG. 2C, boron is doped in order to cancel the influence of phosphorus.

Precisely, phosphorus is doped in the regions 207 and 209, which are then heated to thereby getter nickel into those regions 207 and 209. (These steps are the same as those for producing the N-channel TFT.)

Next, boron is doped under the condition under which the influence of phosphorus is canceled. Next, the porous oxide film 204 is removed.

In the next step of FIG. 2D, boron is lightly doped in the regions 210 and 212.

Next, the thus-layered structure is annealed through exposure to laser rays to form P-type regions 207, 210, 212 and 209. In this, 207 is a source region, 209 is a drain region, and 210 and 212 are low concentration impurity regions.

In this example, boron is doped after the phosphorus doping for gettering, to form the source/drain regions and the low concentration impurity regions. The process of this example has the advantage of gettering in the regions to be source/drain, though being defective in that it requires an increased number of doping steps.

EXAMPLE 5

This is to demonstrate an example of providing a structure composed of a P-channel TFT and an N-channel TFT as combined complementarily.

Figure 3A:
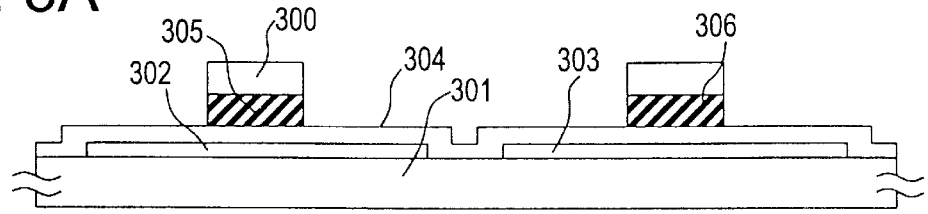
FIG. 3A to FIG. 3E show a process for forming a TFT.

FIG. 3A to FIG. 3E are the steps of the process of this example. Prior to the illustrated process, prepared is a laterally-grown crystalline silicon film according to the process of the steps FIG. 1A to FIG. 1E. Using the laterally-grown region, formed is active layer patterns 302 and 303 as in FIG. 3A. In FIG. 3A, 301 is a glass substrate.

The pattern 302 shall be an active layer pattern of the P-channel TFT, and the pattern 303 is an active layer pattern of the N-channel TFT.

Over the active layer patterns, formed is a gate-insulating film 304. Next, an aluminum film (not shown) is formed, and is patterned through a resist mask 300 to give aluminum patterns 305 and 306. In place of aluminum, also usable is tantalum. Tantalum can be subjected to anodic oxidation, and can be used herein like aluminum.

Figure 3B:
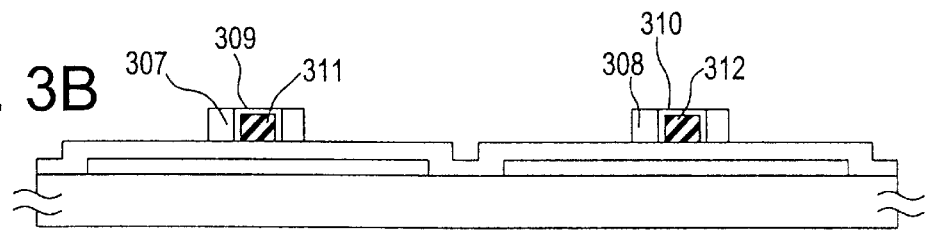

In that manner, obtained is the condition of FIG. 3A. This is then subjected to anodic oxidation to form porous oxide films 307 and 308. In this step, the anodic oxidation is effected while the resist mask 300 (not shown in FIG. 3B) is still as it is, whereby a porous oxide film is formed on the side surfaces of the aluminum pattern. (FIG. 3B)

Next, the resist mask is removed, and then anodic oxidation is again effected. In this step, formed are dense oxide films 309 and 310. (FIG. 3B)

In this condition, the aluminum patterns 311 and 312 which have remained without undergoing anodic oxidation shall be gate electrodes. (FIG. 3B)

Figure 3C:
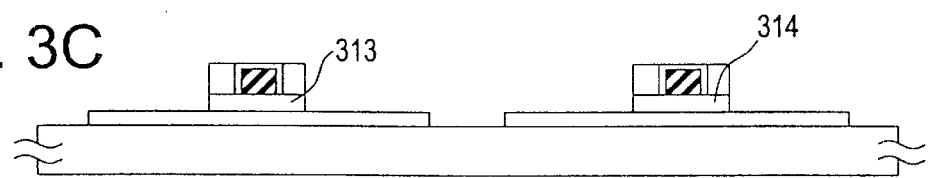

Next, the exposed silicon oxide film is etched through dry etching for vertical anisotropy to be in the condition of FIG. 3C. In this condition, obtained are silicon oxide film patterns 313 and 314.

Next, the porous oxide films 307 and 308 are removed. Then, the two TFT areas are separately doped one by one with phosphorus and boron, while the other TFT area not to be doped is masked (not short).

Figure 3D:
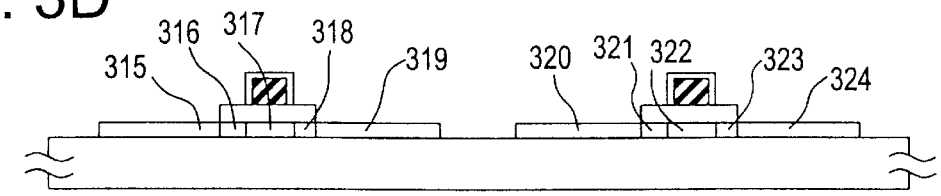
Figure 3E:
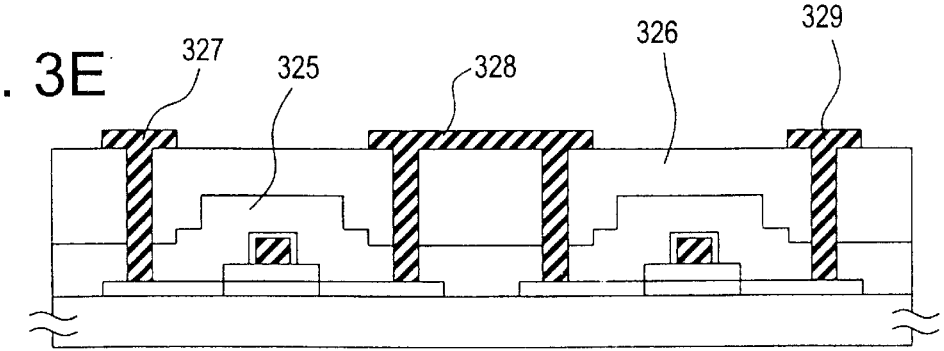

In this step, a part of the remaining silicon oxide films 313 and 314 could be a mask, resulting in that the regions 316, 318, 321 and 323 are more lightly doped with a smaller dose of the dopant than the regions 315, 319, 320 and 324. (FIG. 3D)

In that manner, the heavily-doped regions 315, 319, 320 and 324 are self-aligned, while the lightly-doped regions 316, 318, 321 and 323 are also self-aligned. (FIG. 3D)

Numeral 315 shall be the source region of the P-channel TFT; 319 be the drain region of the P-channel TFT; 324 be the source region of the N-channel TFT; and 320 be the drain region of the N-channel TFT. (FIG. 3D)

On the other hand, the regions 317 and 322 are not doped, and shall be channel regions. 316 and 318 shall be the low concentration impurity regions of the P-channel TFT; and 321 and 323 be the impurity-poor regions of the N-channel TFT.

After the condition shown in FIG. 3D is obtained, an interlayer insulating film of a silicon nitride film 325 is formed, and an acrylic resin film 326 is formed thereon.

Next, contact holes are formed, and then formed are the source electrode 327 of the P-channel TFT, the source electrode 329 of the N-channel TFT, and the drain electrode 328 common to the both TFT. In that manner, completed is a TFT circuit as constructed complementarily.

This circuit shall be the base of shift register circuits, buffer circuits and other integrated circuits.

EXAMPLE 6

This is to demonstrate an example of crystallizing an amorphous silicon film while introducing nickel into the entire surface of the film.

FIG. 4A to FIG. 4E show the process of this example, which comprises a step of producing a crystalline silicon film followed by a step of gettering nickel.

Figure 4A:
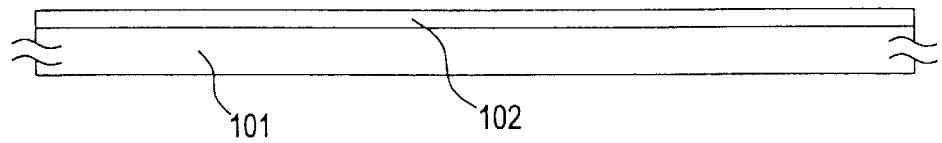
FIG. 4A to FIG. 4E show a process for forming a crystalline silicon film.

First, as in FIG. 4A, formed is an amorphous silicon film 102 on a glass substrate 101.

Figure 4B:
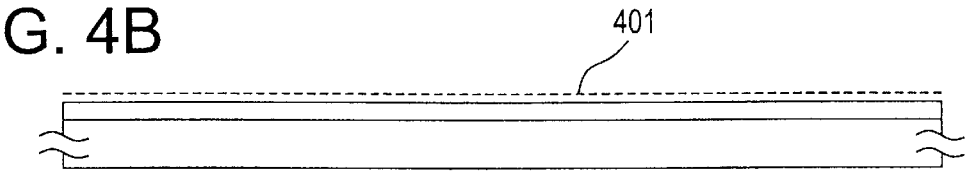

Next, a nickel acetate solution is applied onto the entire surface of the film 102 to thereby introduce nickel 401 on the entire surface of the film 102. (FIG. 4B)

Next, the amorphous silicon film is crystallized under heat into a crystalline silicon film 402. Precisely, the film is heated at 600° C. for 8 hours. Since no lateral crystal growth is intended to occur in this step, the film may be heated at a temperature at which spontaneous will nucleation occur. (FIG. 4B)

In this crystallization step, the crystals grow radially, like flowering, after having started from the nucleation points that randomly exist on the surface. Microscopically observing the area where the crystals are growing, seen is lateral crystal growth morphology which is the same as in FIG. 1C.

Figure 4C:
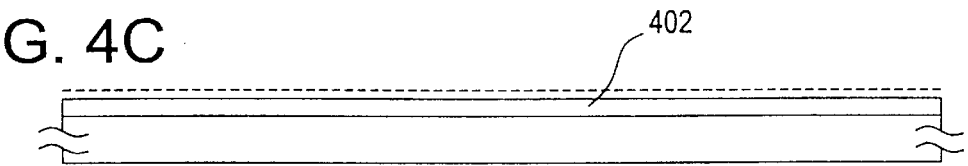
Figure 4D:
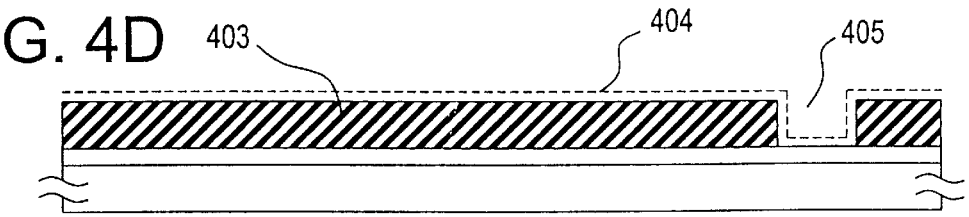

As a result, obtained is the crystalline silicon film 402, as in FIG. 4C. Next, a mask 403 of a silicon oxide film is formed. This mask 403 has an opening 405. (FIG. 4D)

Next, a phosphorus-containing solution is applied to this, whereby phosphorus is kept in contact with the surface in the condition referred to by 404. (FIG. 4D)

In that condition, phosphorus is kept in contact with the surface of the crystalline silicon film 402 only at a limited region (that is, at the region of the opening 405).

Figure 4E:
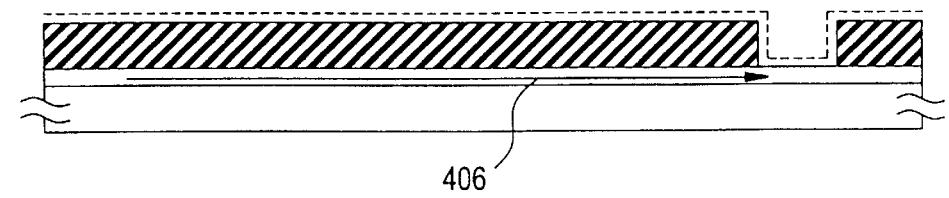

Next, this is heated, whereby the nickel having diffused throughout the entire film moves toward the region of the opening 405 (that is, toward the region with which phosphorus is kept in contact). In that manner, nickel is gettered by phosphorus. (FIG. 4E)

After the step of FIG. 4D, formed is the active layer of TFT at the region at which the nickel gettering 406 has finished. Next, in the same manner as in Example 1, produced is the intended TFT.

Herein demonstrated is the production of TFT. Apart from this, the crystalline silicon film formed herein can be used for producing resistors, diodes, capacitors, semiconductor sensors and others.

EXAMPLE 7

This is to demonstrate an example of producing an inverted staggered TFT. FIG. 5A to FIG. 5D show the process of this example. First, as in FIG. 5A, formed is an underlying film of a silicon oxide film 502 on a glass substrate.

If the surface of the glass substrate is smooth and if the glass substrate is free from the problem of impurity diffusion, this underlying film may be omitted.

Next, using tantalum, formed is a gate electrode 503. The surface of the gate electrode 503 may have an oxide film formed through anodic oxidation thereon.

The gate electrode may be any of tantalum-tantalum nitride laminates, or one conductivity type silicon, silicides, metals or the like.

It is desirable that the cross section of the gate electrode 503 is tapered. This is important for the subsequent crystallization and gettering stems.

After the gate electrode 503 is formed, a gate-insulating film of a silicon oxide film 504 is formed. Next is formed an amorphous silicon film 505.

A mask 506 of a silicon oxide film is formed over the film 505. This mask 506 has an opening 507. The horizontal cross section of this opening is of a long and narrow rectangular form that extends from the front side of the drawing to the depth thereof.

Figure 5A:
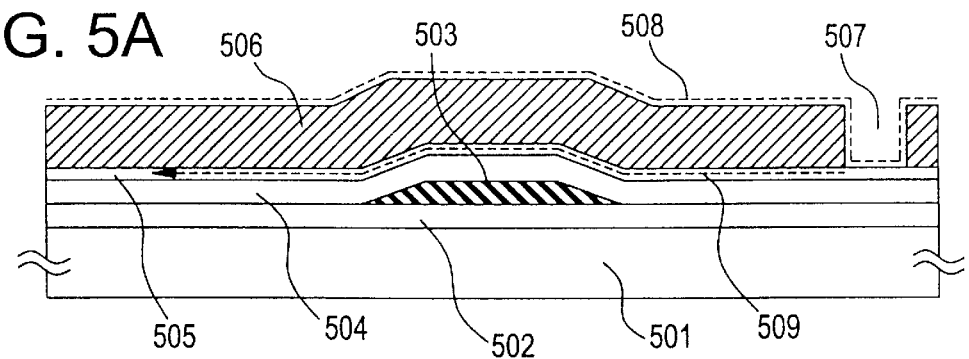
FIG. 5A to FIG. 5D show a process for forming a TFT.

Next, a nickel-containing solution is applied to this so that nickel is kept in contact with the surface of the layered structure, as so indicated by 508. (FIG. 5A)

In this condition, nickel is kept in contact with the amorphous silicon film 505 at the region of the opening 507 formed through the mask 506.

Next, this is heated, whereby the crystals are grown along the diffusion of nickel, as so indicated by 509. (FIG. 5A)

In this step, if the cross section of the gate electrode is not tapered, the crystal growth could not be attained smoothly. This is because, if not tapered, the crystal growth in the amorphous silicon film will be retarded at the step to be formed by the non-tapered gate electrode.

Figure 5B:
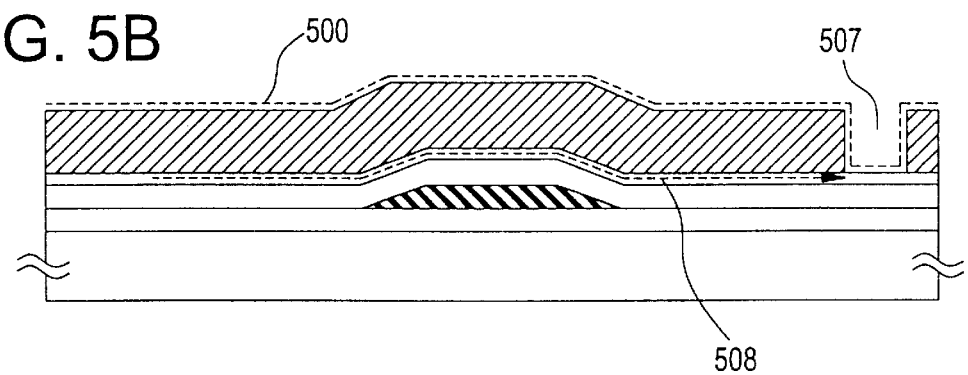

Next, a phosphorus-containing solution is applied to this, whereby phosphorus is kept in contact with the surface, as so indicated by 500. (FIG. 5B)

In this condition, phosphorus is kept in contact with the surface of the silicon film at the region of the opening 507.

Next, this is again heated. In this step, nickel having diffused in the silicon film moves toward the region of the opening 507, along the route indicated by 508. Accordingly, nickel is gettered in the region into which phosphorus has been introduced. (FIG. 3B)

Next, the silicon oxide film mask 506 is removed, and the laterally-grown region of the crystalline silicon film is formed into an active layer of a TFT. This active layer shall have an island eastern composed of regions 510, 511 and 512, as in FIG. 5C.

Figure 5C:
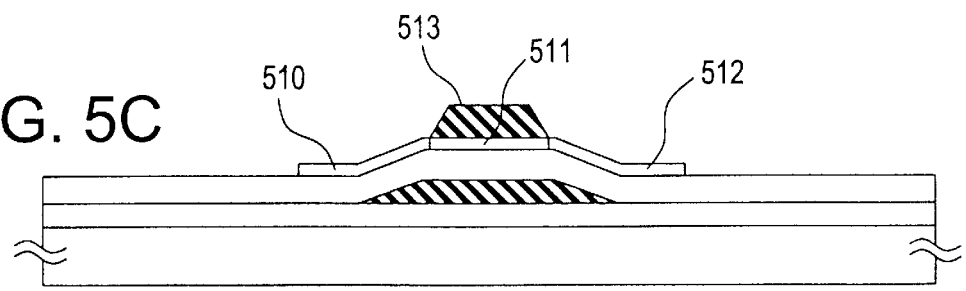
Figure 5D:
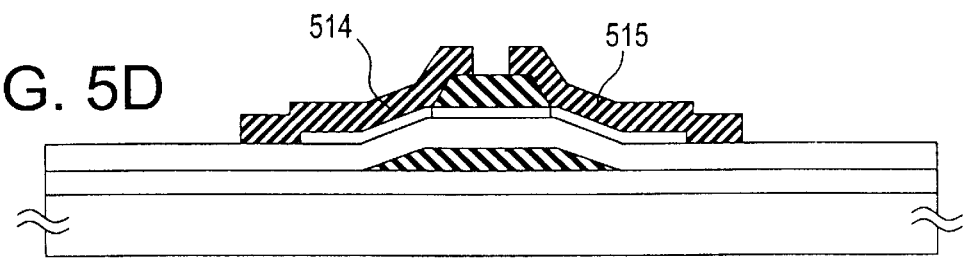

Next, a mask 509 of a silicon oxide film is formed. Via this mask, phosphorus is doped according to a plasma doping method (or an ion implantation method). Thus are formed a source region 510, a drain region 512 and a channel region 511. (FIG. 5C)

After the doping, this is exposed to laser light, whereby the crystal structure formed in the doped region is annealed and the dopant is activated. (FIG. 5C)

Next, formed are a source electrode 514 and a drain electrode 515 of a laminate of a titanium film, an aluminum film and a titanium film. Thus is completed the inversed staggered TFT, as in FIG. 5D.

EXAMPLE 8

This is a modification of the structure of Example 7. FIG. 6A to FIG. 6D show the process of this example.

Figure 6A:
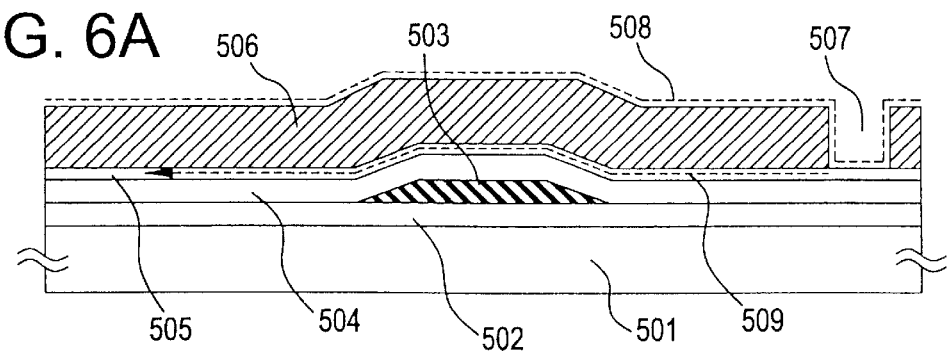
FIG. 6A to FIG. 6D show a process for forming a TFT.
Figure 6B:
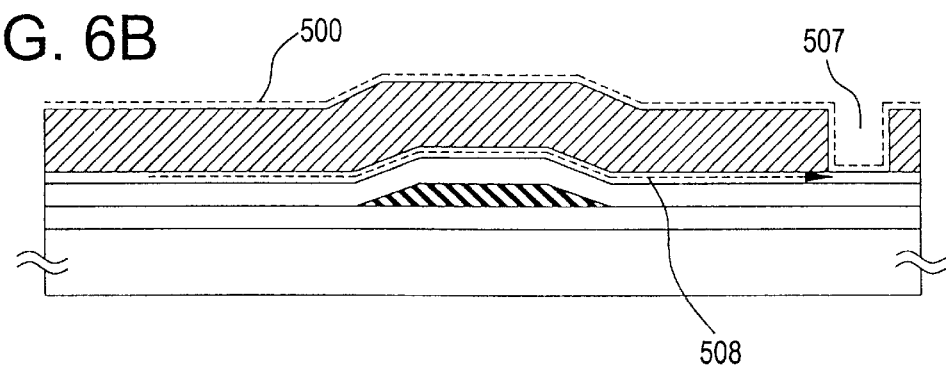

First, a layered structure of FIG. 6B is obtained, in the same manner as in Example 7.

Figure 6C:
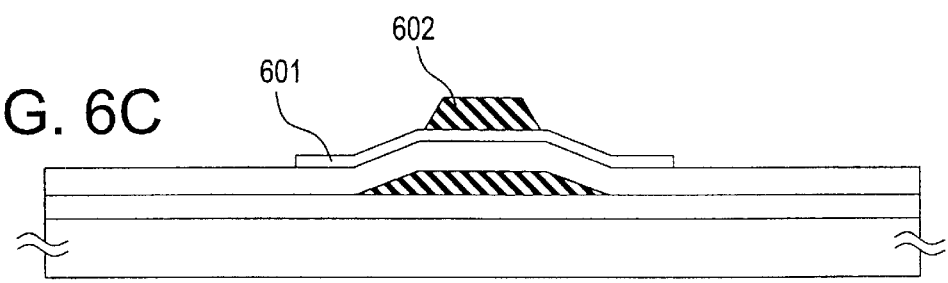
Figure 6D:
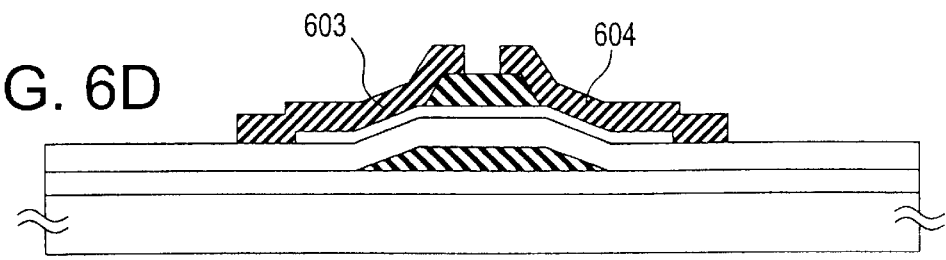

Next, an active layer 601 is formed, as in FIG. 6C. Then, a mask 602 of a silicon oxide film is formed over the layer 601.

Next, an N-type microcrystalline silicon film is formed and patterned to give patterns 603 and 604. In this, 603 shall be a source region, and 604 be a drain region. Thus is completed an N-channel TFT.

The microcrystalline film having high conductivity is used herein, which may be replaced by an amorphous silicon film. If P-type microcrystalline film is used in place of the N-type microcrystalline film, a P-channel TFT is obtained.

EXAMPLE 9

Figure 7A:
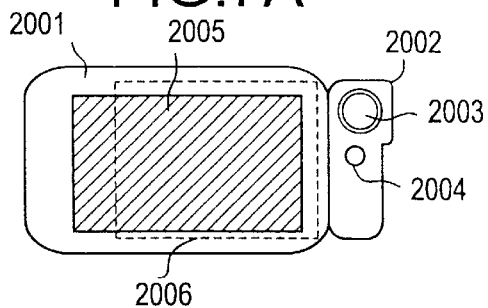
FIG. 7A to FIG. 7F are graphical views of semiconductor devices comprising TFT.

Herein shown are examples of various semiconductor devices comprising TFT as produced according to the invention. FIG. 7A is a portable, information-processing terminal. The body 2001 of this information-processing terminal is provided with an active-matrix type, liquid crystal display or an active matrix-type, EL display, and with a camera member 2002 through which it takes external information.

The camera member 2002 is provided with an image-receiving part 2003 and a control switch 2004.

It is expected that information-processing terminals will be thinner and more lightweight for enhancing their portability.

In the illustrated constitution, it is desirable that the peripheral drive circuit, arithmetic circuit and memory circuit to be on the substrate on which the active-matrix type display 2005 is formed are integrated with TFT. In FIG. 7A, Numeral 2006 is an integrated circuit.

Figure 7B:
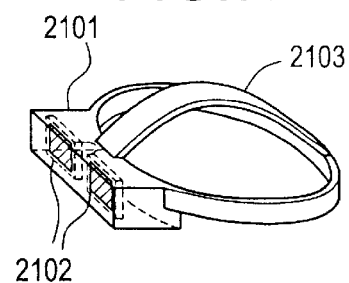

FIG. 7B is a head-mount display. Its body 2101 is provided with an active-matrix type, liquid crystal display or EL display 2102. The body 2101 can be mounted on the head with the band 2103.

Figure 7C:
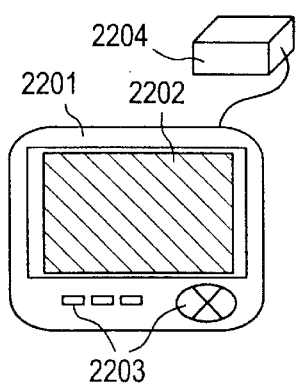

FIG. 7C is a car navigation device. Its body 2201 is provided with a liquid crystal display device 2202 and a control switch 2203. The car navigation device of that type has a function of displaying geographic information and the like, in accordance with the signals received by the antenna 2204.

Figure 7D:
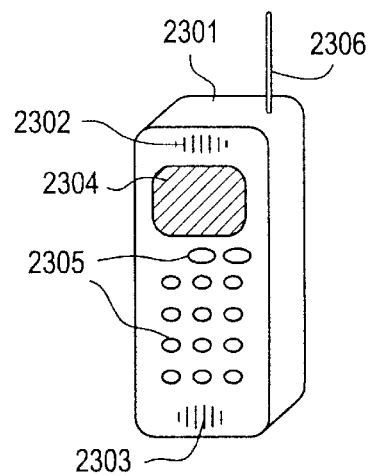

FIG. 7D is a portable telephone. Its body 2301 is provided with an active-matrix type, liquid crystal display device 2304, a control switch 2305, a voice-inputting member 2303, a voice-outputting member 2302 and an antenna 2306.

Recently, a combination composed of the portable, information-processing terminal of FIG. 7A and the portable telephone of FIG. 7D has been commercialized. Even in that constitution, the active-matrix type display and the other circuits are preferably integrated on one and the same substrate with TFT.

Figure 7E:
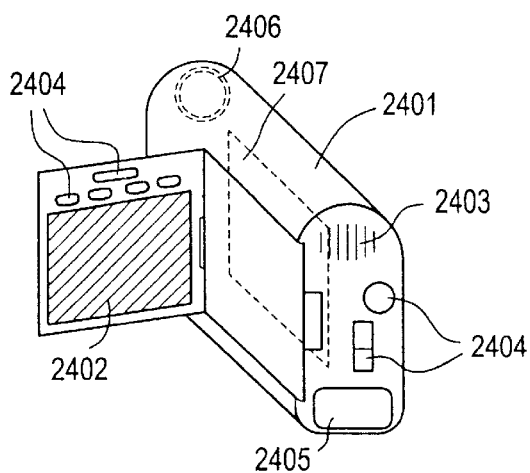

FIG. 7E is a portable video camera. Its body 2401 is provided with an image-receiving member 2406, a voice-inputting member 2403, a control switch 2404, an active-matrix type, liquid crystal display 2402, and a battery 2405.

Figure 7F:
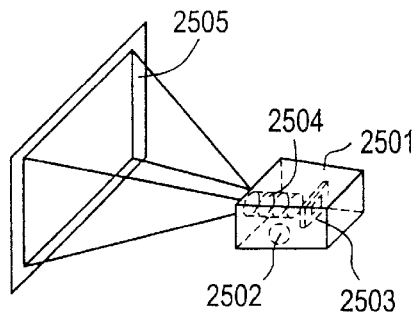

FIG. 7F is a projection-type, liquid crystal display device. Its body 2501 is provided with a light source 2502, an active-matrix type, liquid crystal display device 2503, and an optical system 2504. This projection device has a function of displaying images on a screen 2505 positioned outside the device.

The liquid crystal display device to be used in the examples illustrated herein may be any of transmission-type ones or reflection-type ones.

In the devices of FIG. 7A to FIG. 7E, also usable are active-matrix type, EL displays in place of the liquid crystal display devices.

As has been described in detail herein, the present invention provides TFT of which the active layers are formed from a crystalline silicon layer to be produced by the use of a metal element capable of promoting the crystallization of silicon, and is characterized in that it provides a technique of reducing the concentration of the metal element that may remain in the active layers of TFT. According to the invention, therefore, the semiconductor device produced has high-quality characteristics and high reliability.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device comprising the steps of:

forming a semiconductor film comprising amorphous silicon on an insulating surface;

providing said semiconductor film with a crystallization promoting material comprising a metal for promoting crystallization of said semiconductor film;

heating said semiconductor film and said crystallization promoting material to crystallize said semiconductor film;

applying a solution in contact with the crystallized semiconductor film, said solution containing phosphorus; and heating the crystallized semiconductor film whereby the metal contained in the crystallized semiconductor film is gettered by said phosphorus.

2. The method according to claim 1 wherein said solution contains $P_2O_5$ or $H_xPO_3$.

3. The method according to claim 1 wherein the heating of the crystallized semiconductor film for gettering is carried out by RTA.

4. The method according to claim 1 wherein said semiconductor device is selected from the group consisting of a portable information-processing terminal, a head-mount display, a car navigation, a portable telephone, a video camera and a projection.

5. The method according to claim 1 wherein said semiconductor device is an EL display device.

6. The method according to claim 1 wherein said metal is selected from the group consisting of Fe, Co, Ni, Ru, Rh, Pd, Os, Ir, Pt, Cu, Au, Ge, Pb, In and Sb.

7. The method according to claim 4, wherein the method further comprises:

introducing phosphorus into selected portions of said active layer to form impurity regions;

heating said active layer after said introduction of phosphorus.

8. A method of manufacturing a semiconductor device comprising the steps of:

forming a semiconductor film comprising amorphous silicon on an insulating surface;

providing said semiconductor film with a crystallization promoting material comprising a metal for promoting crystallization of said semiconductor film;

heating said semiconductor film and said crystallization promoting material to crystallize said semiconductor film;

applying a solution in contact with a selected portion of the crystallized semiconductor film, said solution containing phosphorus;

heating the crystallized semiconductor film whereby the metal contained in the crystallized semiconductor film is gettered by said portion of the crystallized semiconductor film; and patterning the crystallized semiconductor film to form an active layer.

9. The method according to claim 8 wherein said solution contains $P_2O_5$ or $H_xPO_3$.

10. The method according to claim 8 wherein the heating of the crystallized semiconductor film for gettering is carried out by RTA.

11. The method according to claim 8 wherein said semiconductor device is selected from the group consisting of a portable information-processing terminal, a head-mount display, a car navigation, a portable telephone, a video camera and a projection.

12. The method according to claim 8 wherein said semiconductor device is an EL display device.

13. The method according to claim 8 wherein said metal is selected from the group consisting of Fe, Co, Ni, Ru, Rh, Pd, Os, Ir, Pt, Cu, Au, Ge, Pb, In and Sb.

14. A method of manufacturing a semiconductor device comprising the steps of:

forming a semiconductor film comprising amorphous silicon on an insulating surface;

providing said semiconductor film with a crystallization promoting material comprising a metal for promoting crystallization of said semiconductor film;

heating said semiconductor film and said crystallization promoting material to crystallize said semiconductor film;

applying a solution in contact with a selected portion of the crystallized semiconductor film, said solution containing phosphorus;

heating the crystallized semiconductor film whereby the metal contained in the crystallized semiconductor film is gettered by said portion of the crystallized semiconductor film; and patterning the crystallized semiconductor film to form an active layer;

forming a gate insulating film on the active layer; and forming a gate electrode on the gate insulating film.

15. The method according to claim 14 wherein said solution contains $P_2O_5$ or $H_xPO_3$.

16. The method according to claim 14 wherein the heating of the crystallized semiconductor film for gettering is carried out by RTA.

17. The method according to claim 14 wherein said semiconductor device is selected from the group consisting of a portable information-processing terminal, a head-mount display, a car navigation, a portable telephone, a video camera and a projection.

18. The method according to claim 14 wherein said semiconductor device is an EL display device.

19. The method according to claim 14 wherein said metal is selected from the group consisting of Fe, Co, Ni, Ru, Rh, Pd, Os, Ir, Pt, Cu, Au, Ge, Pb, In and Sb.

20. A method of manufacturing a semiconductor device comprising the steps of:

forming a gate electrode on an insulating surface;

forming a gate insulating film on the gate electrode;

forming a semiconductor film comprising amorphous silicon on said gate insulating film;

providing said semiconductor film with a crystallization promoting material comprising a metal for promoting crystallization of said semiconductor film;

heating said semiconductor film and said crystallization promoting material to crystallize said semiconductor film;

applying a solution in contact with a selected portion of the crystallized semiconductor film, said solution containing phosphorus;

heating the crystallized semiconductor film whereby the metal contained in the crystallized semiconductor film is gettered by said portion of the crystallized semiconductor film; and patterning the crystallized semiconductor film to form an active layer.

21. The method according to claim 20 wherein said solution contains $P_2O_5$ or $H_xPO_3$.

22. The method according to claim 20 wherein the heating of the crystallized semiconductor film for gettering is carried out by RTA.

23. The method according to claim 20 wherein said semiconductor device is selected from the group consisting of a portable information-processing terminal, a head-mount display, a car navigation, a portable telephone, a video camera and a projection.

24. The method according to claim 20 wherein said semiconductor device is an EL display device.

25. The method according to claim 20 wherein said metal is selected from the group consisting of Fe, Co, Ni, Ru, Rh, Pd, Os, Ir, Pt, Cu, Au, Ge, Pb, In and Sb.

26. The method according to claim 1, wherein after applying said solution, said solution is dried so that a layer comprising phosphorus is formed on said crystallized semiconductor film.

* * * * *